(12) United States Patent
Tai et al.

(10) Patent No.: US 8,482,639 B2
(45) Date of Patent: Jul. 9, 2013

(54) BLACK REFERENCE PIXEL FOR BACKSIDE ILLUMINATED IMAGE SENSOR

(75) Inventors: Hsin-Chih Tai, Cupertino, CA (US);
Vincent Venezia, Sunnyvale, CA (US);
Duli Mao, Sunnyvale, CA (US);
Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 853 days.

(21) Appl. No.: 12/028,590

(22) Filed: Feb. 8, 2008

(65) Prior Publication Data

US 2009/0201393 A1    Aug. 13, 2009

(51) Int. Cl.
*H04N 9/64*    (2006.01)

(52) U.S. Cl.
USPC .......................................... 348/245; 348/243

(58) Field of Classification Search
USPC ....... 257/226, 227, 228, 291, 460; 250/208.1, 250/208.2; 348/243, 245–247, 294–324
See application file for complete search history.

(56) References Cited

U.S. PATENT DOCUMENTS

| | | | |
|---|---|---|---|
| 4,760,031 A | 7/1988 | Janesick | |
| 5,688,715 A | 11/1997 | Sexton et al. | |
| 6,169,319 B1 | 1/2001 | Malinovich et al. | |
| 6,489,992 B2 | 12/2002 | Savoye | |
| 6,724,022 B1 | 4/2004 | Yoshida | |
| 6,903,768 B1 * | 6/2005 | Ohsawa et al. | 348/241 |
| 6,960,796 B2 | 11/2005 | Rhodes et al. | |
| 7,005,637 B2 | 2/2006 | Costello et al. | |
| 7,247,829 B2 * | 7/2007 | Oda | 250/208.1 |
| 8,129,809 B2 | 3/2012 | Jang | |
| 8,233,066 B2 | 7/2012 | Zheng et al. | |
| 2001/0052574 A1 * | 12/2001 | Kurosawa et al. | 250/423 P |
| 2003/0146987 A1 | 8/2003 | Prentice et al. | |
| 2003/0173582 A1 | 9/2003 | Hatano et al. | |

(Continued)

FOREIGN PATENT DOCUMENTS

| | | |
|---|---|---|
| EP | 1612863 A2 | 1/2006 |
| EP | 1058313 A2 | 12/2006 |
| EP | 1858082 | 11/2007 |
| JP | 3240379 A | 10/1991 |

OTHER PUBLICATIONS

Janesick, J. "Charge coupled CMOS and hybrid detector arrays," SPIE, San Diego, Focal Plane Arrays for Space Telescope, paper #5167-1, Aug. 2003.

(Continued)

*Primary Examiner* — Sinh Tran
*Assistant Examiner* — Christopher K Peterson
(74) *Attorney, Agent, or Firm* — Blakely, Sokoloff, Taylor & Zafman LLP (57) ABSTRACT

An imaging sensor pixel array includes a semiconductor substrate, a plurality of active pixels and at least one black reference pixel. The plurality of active pixels are disposed in the semiconductor substrate for capturing an image. Each of the active pixels includes a first region for receiving light including a p-n junction for accumulating an image charge and active pixel circuitry coupled to the first region to readout the image charge. The black reference pixel is also disposed within the semiconductor substrate for generating a black level reference value. The black reference pixel includes a second region for receiving light without a p-n junction and black pixel circuitry coupled to the photodiode region without the p-n junction to readout a black level reference signal.

19 Claims, 7 Drawing Sheets

U.S. PATENT DOCUMENTS

| | | |
|---|---|---|
| 2004/0051124 A1 | 3/2004 | Kawasaki |
| 2004/0169248 A1* | 9/2004 | Costello et al. ............... 257/460 |
| 2005/0243194 A1* | 11/2005 | Xu ................................ 348/241 |
| 2006/0006488 A1 | 1/2006 | Kanbe |
| 2006/0076590 A1 | 4/2006 | Pain et al. |
| 2007/0001252 A1* | 1/2007 | Noda et al. .................... 257/432 |
| 2007/0259463 A1 | 11/2007 | Abedini |
| 2008/0001192 A1 | 1/2008 | Inoue et al. |
| 2008/0150057 A1 | 6/2008 | Lee et al. |
| 2008/0197268 A1 | 8/2008 | Kameda |
| 2008/0283726 A1* | 11/2008 | Uya et al. ................... 250/208.1 |
| 2009/0109307 A1 | 4/2009 | Nisida et al. |
| 2010/0079635 A1 | 4/2010 | Yano et al. |
| 2010/0110271 A1 | 5/2010 | Yanagita et al. |
| 2010/0214457 A1 | 8/2010 | Sakai |
| 2011/0164459 A1 | 7/2011 | Toyoshima |
| 2011/0199518 A1 | 8/2011 | Zheng et al. |
| 2011/0207250 A1 | 8/2011 | Uya |
| 2012/0249845 A1 | 10/2012 | Zheng et al. |

OTHER PUBLICATIONS

PCT/US2009/032897, PCT International Search Report and Written Opinion of the International Searching Authority, mailed Apr. 16, 2009, 15 pages.

TW 098103971; Office Action and Search Report issued Mar. 5, 2013, 13 pages.

* cited by examiner

BLACK REFERENCE PIXEL FOR BACKSIDE ILLUMINATED IMAGE SENSOR

TECHNICAL FIELD

This disclosure relates generally to image sensors, and in particular but not exclusively, relates to backside illuminated CMOS image sensors.

BACKGROUND INFORMATION

Modern complementary metal-oxide-semiconductor ("CMOS") imagers often include some sort of feedback loop to automatically set the black level in the output. The analog voltage associated with true black may be obtained by reading "black reference pixels." Black reference pixels are typically arrayed immediately next to the active image array. In frontside illuminated ("FSI") image sensors, one of the metal layers within the frontside metal stack shields the reference pixels in order to block any incoming light. Circuitry within the FSI image sensor then sets the voltage output for the active pixels with reference to the output value from these black reference pixels. The black reference pixels are used to generate a low count value or a user specified set point value that will typically be displayed as black. Cameras are traditionally setup to a black level set point that is slightly greater than the read noise. Camera gain is then set to achieve a suitable image. Setting the proper black level is particularly important when working at very low signal levels or low ambient light environments. If the black level is set too low, dim objects will be clipped and not displayed. If the black level is set too high, image contrast will suffer.

Figure 1A:
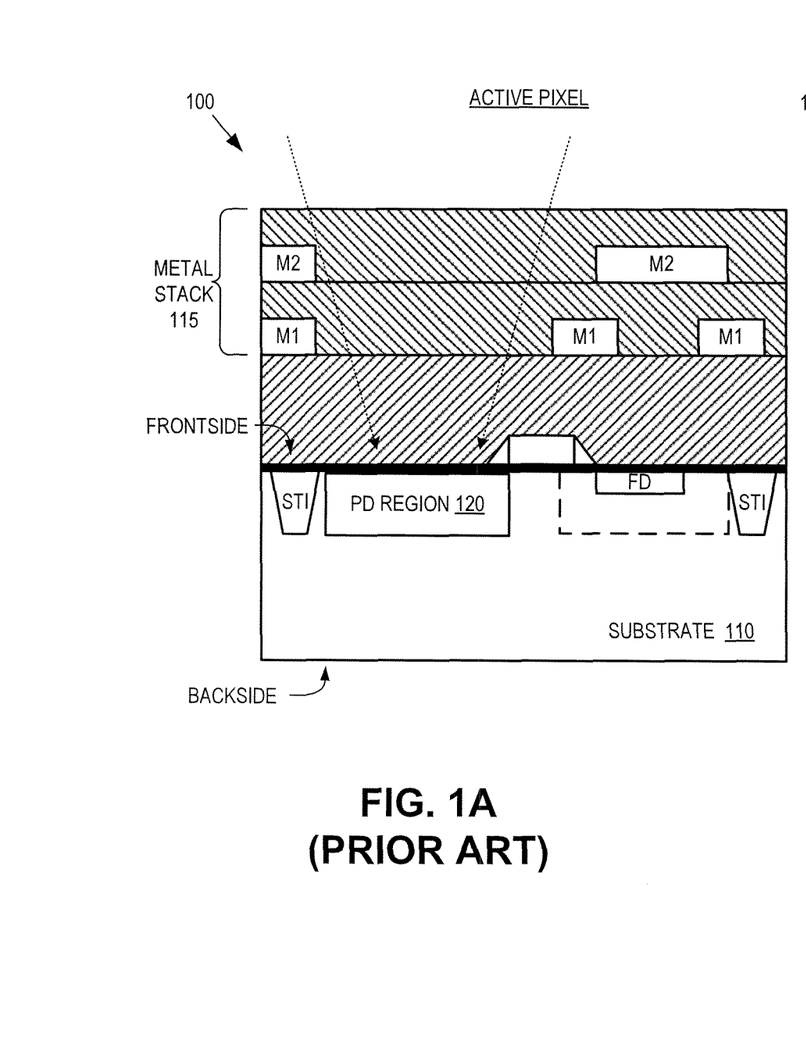
FIG. 1A is a cross-sectional view of a conventional frontside illuminated ("FSI") active pixel.
Figure 1B:
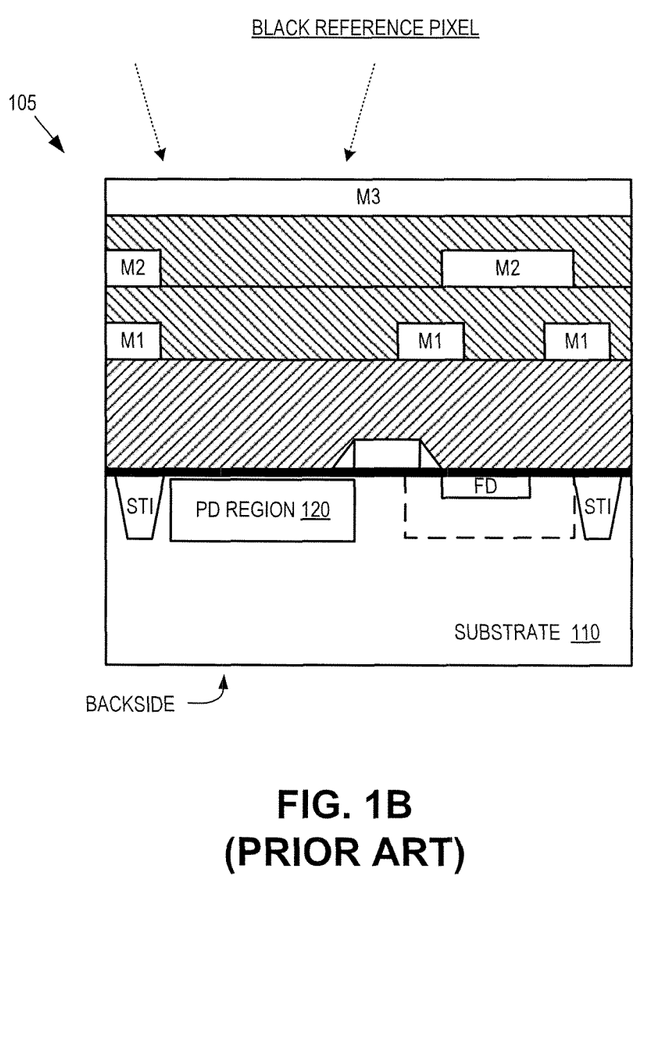
FIG. 1B is a cross-sectional view of a conventional FSI black reference pixel.

FIG. 1A illustrates a conventional active pixel 100 of a FSI image sensor, while FIG. 1B illustrates a conventional black reference pixel 105 of a FSI image sensor. The frontside of imaging pixels 100 or 105 is the side of substrate 110 upon which the pixel circuitry is disposed and over which metal stack 115 for redistributing signals is formed. In active pixel 100, the metal layers (e.g., metal layer M1 and M2) are patterned in such a manner as to create an optical passage through which light incident on the frontside of active pixel 100 can reach the photosensitive photodiode ("PD") region 120. In contrast, the optical passage of black reference pixel 105 is intentionally blocked and covered over with a metal layer M3.

When FSI image sensors are thinned via traditional methods, the backs of the black level reference pixels are exposed, as are the pixels in the active imaging array. Consequently, light and electrons incident upon the back of the die may induce signal noise in black reference pixel 105, thereby voiding its value as a black reference pixel. In order to regain the benefit of black reference pixels on backside thinned FSI image sensors, die shielding of incident electrons (or photons) is often used. One approach to such shielding is to deposit a metal layer over the backside of black reference pixel 105, as typically used on the front side. However, in order to maintain a low dark current either a special metalization is required for this backside metal layer or a dopant profile must be specified on the backside surface before the metal is deposited. In either case, this additional backside processing requires significant additional processes. This additional processing may involve a photolithography step to define the deposition area. The added masking and handling associated with photolithography can damage the sensitive frontside surface, thereby reducing yields.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a system and method of operation for a backside illuminated ("BSI") imaging system with black reference pixels are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 2:
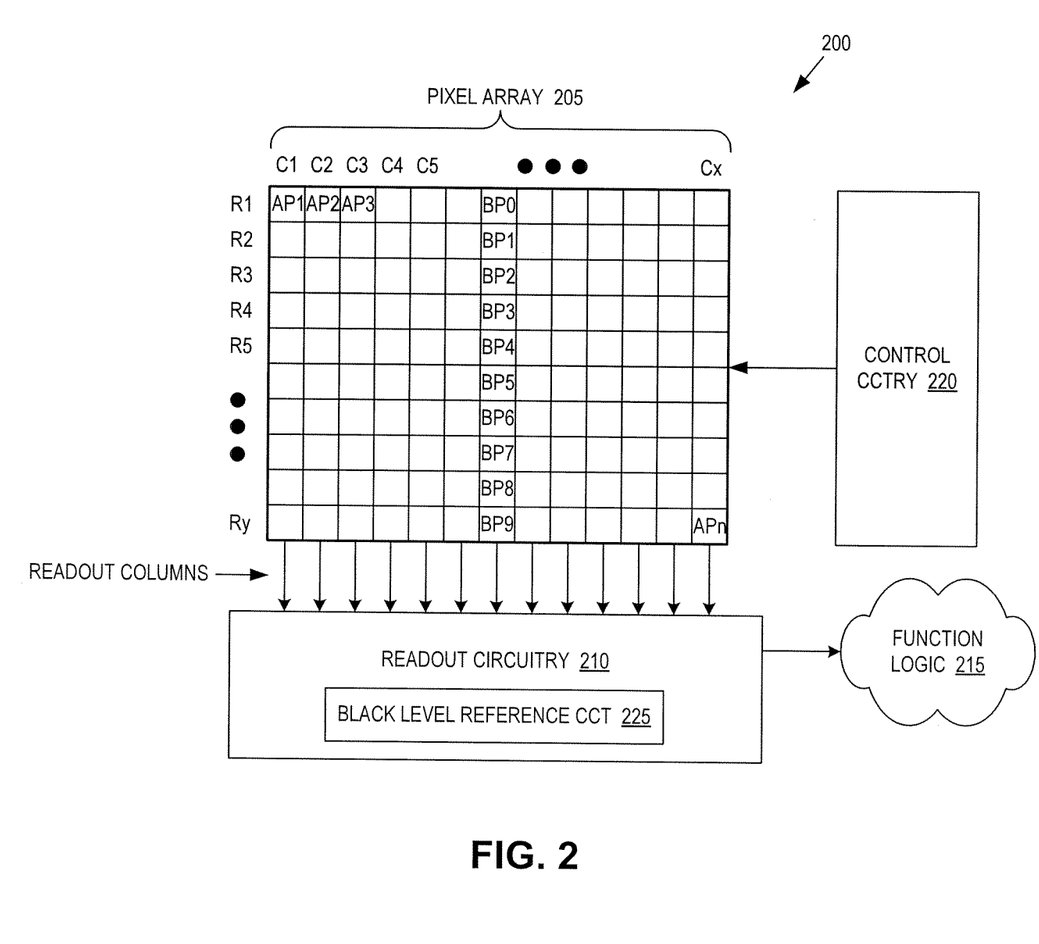
FIG. 2 is a block diagram illustrating a backside illuminated ("BSI") imaging system including black reference pixels, in accordance with an embodiment of the invention.

FIG. 2 is a block diagram illustrating a BSI imaging system 200, in accordance with an embodiment of the invention. The illustrated embodiment of BSI imaging system 200 includes a pixel array 205, readout circuitry 210, function logic 215, and control circuitry 220.

Pixel array 205 is a two-dimensional ("2D") array of BSI imaging sensors or active pixels (e.g., AP1, AP2 . . . , APn) and black reference pixels (e.g., BP0, BP1 . . . BP9). In one embodiment, each active pixel is an active pixel sensor ("APS"), such as a complementary metal-oxide-semiconductor ("CMOS") imaging pixel. In one embodiment, black reference pixels include similar or identical structure to their active pixel counterparts with the exception that their photodiode region lacks a p-n junction.

As illustrated, each active pixel is arranged into a row (e.g., rows R1 to Ry) and a column (e.g., column C1 to Cx) to acquire image data of a person, place, or object, which can then be used to render a 2D image of the person, place, or object. Pixel array 205 includes one or more black reference pixels for outputting a black reference signal that may be used to calibrate a black level set point of the active pixels. In the illustrated embodiment, pixel array 205 includes black reference pixels BP0-BP9 aligned in a single column down the center of pixel array 205. In this case, each black reference pixel may be used to calibrate the active pixels within its row. Accordingly, each black reference pixel is logically grouped with one or more active pixels to calibrate the black level set point of its associated active pixels. Since many of the influences on the black level set point of each active pixel have localized variations, it may be desirable to distribute the black reference pixels throughout pixel array 205 to account for these localized variations. Some of these localized influences may include temperature, parasitic capacitances, structural design differences, lattice structure defects, and the like. Consequently, pixel array 205 may include any number of black reference pixels distributed throughout pixel array 205 in a variety of different patterns (e.g., around the perimeter, in one or more columns, in one or more rows, in one or more clusters, in a checkerboard pattern, in an irregular distribution, or otherwise).

After each active pixel has acquired its image data or image charge, the image data is readout by readout circuitry 210 and transferred to function logic 215. Readout circuitry 210 may include amplification circuitry, analog-to-digital conversion circuitry, or otherwise. In one embodiment, readout circuitry 210 includes black level reference circuitry 225 for adjusting or calibrating the black level set point of each active pixel. The black level set point is the signal level output from each active pixel at which the pixel is deemed to have captured a black image. Black level reference circuitry 225 sets the voltage output for each of the active pixels with reference to the output value from its corresponding black reference pixel. The black reference pixels generate a low count value or a user specified set point value that will typically be displayed as black. Cameras are traditionally setup to a black level set point that is slightly greater than the read noise. If the black level set point is set too low, dim objects will be clipped and not displayed. If the black level set point is set too high, image contrast will suffer.

In one embodiment, readout circuitry 210 may readout a row of image data at a time along readout column lines (illustrated) or may readout the image data using a variety of other techniques (not illustrated), such as a serial readout or a full parallel readout of all pixels simultaneously. Once read out, function logic 215 may simply store the image data or even manipulate it by applying post image effects (e.g., crop, rotate, remove red eye, adjust brightness, adjust contrast, or otherwise).

Control circuitry 220 is coupled to pixel array 205 to control operational characteristic of pixel array 205. For example, control circuitry 220 may generate a shutter signal for controlling image acquisition. In one embodiment, the shutter signal is a global shutter signal for simultaneously enabling all pixels within pixel array 205 to simultaneously capture their respective image data during a single acquisition window. In an alternative embodiment, the shutter signal is a rolling shutter signal whereby each row, column, or group of pixels is sequentially enabled during consecutive acquisition windows.

Figure 3:
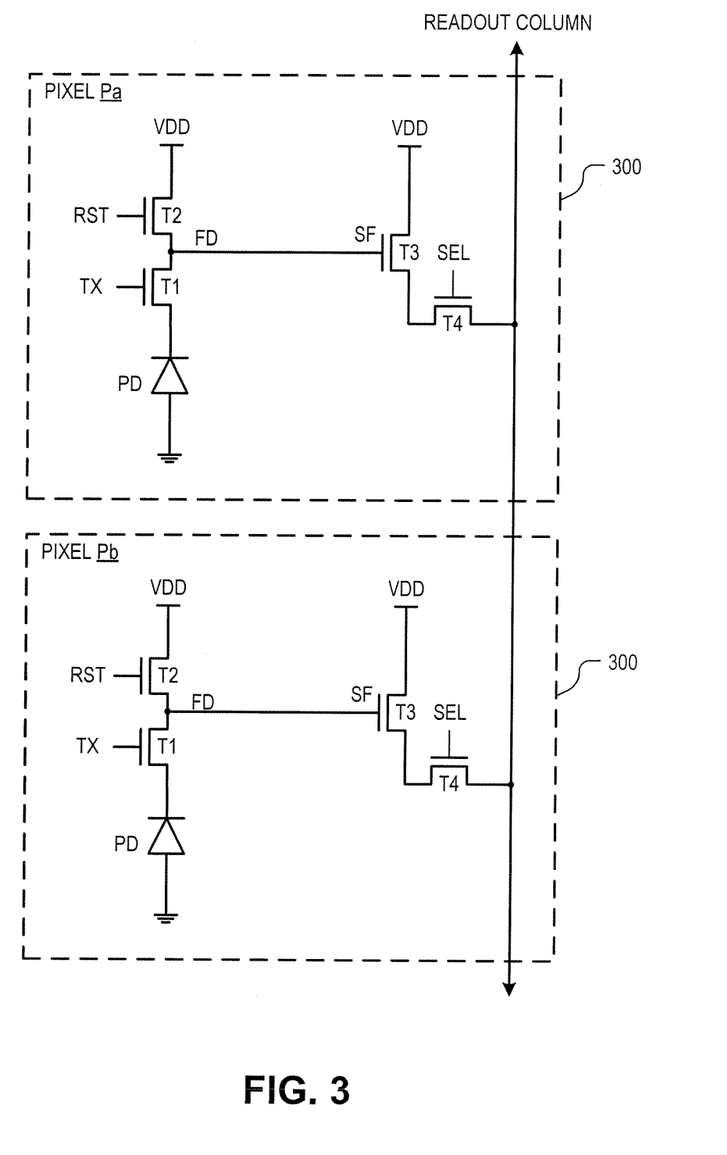
FIG. 3 is a circuit diagram illustrating pixel circuitry of two 4T pixels within a BSI imaging system, in accordance with an embodiment of the invention.

FIG. 3 is a circuit diagram illustrating pixel circuitry 300 of two four-transistor ("4T") active pixels within a BSI imaging array, in accordance with an embodiment of the invention. Pixel circuitry 300 is one possible pixel circuitry architecture for implementing each active pixel within pixel array 200 of FIG. 2. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 3, pixels Pa and Pb are arranged in two rows and one column. The illustrated embodiment of each pixel circuitry 300 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD.

Reset transistor T2 is coupled between a power rail VDD and the floating diffusion node FD to reset (e.g., discharge or charge the FD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance output from the pixel. Finally, select transistor T4 selectively couples the output of pixel circuitry 300 to the readout column line under control of a select signal SEL.

Figure 4:
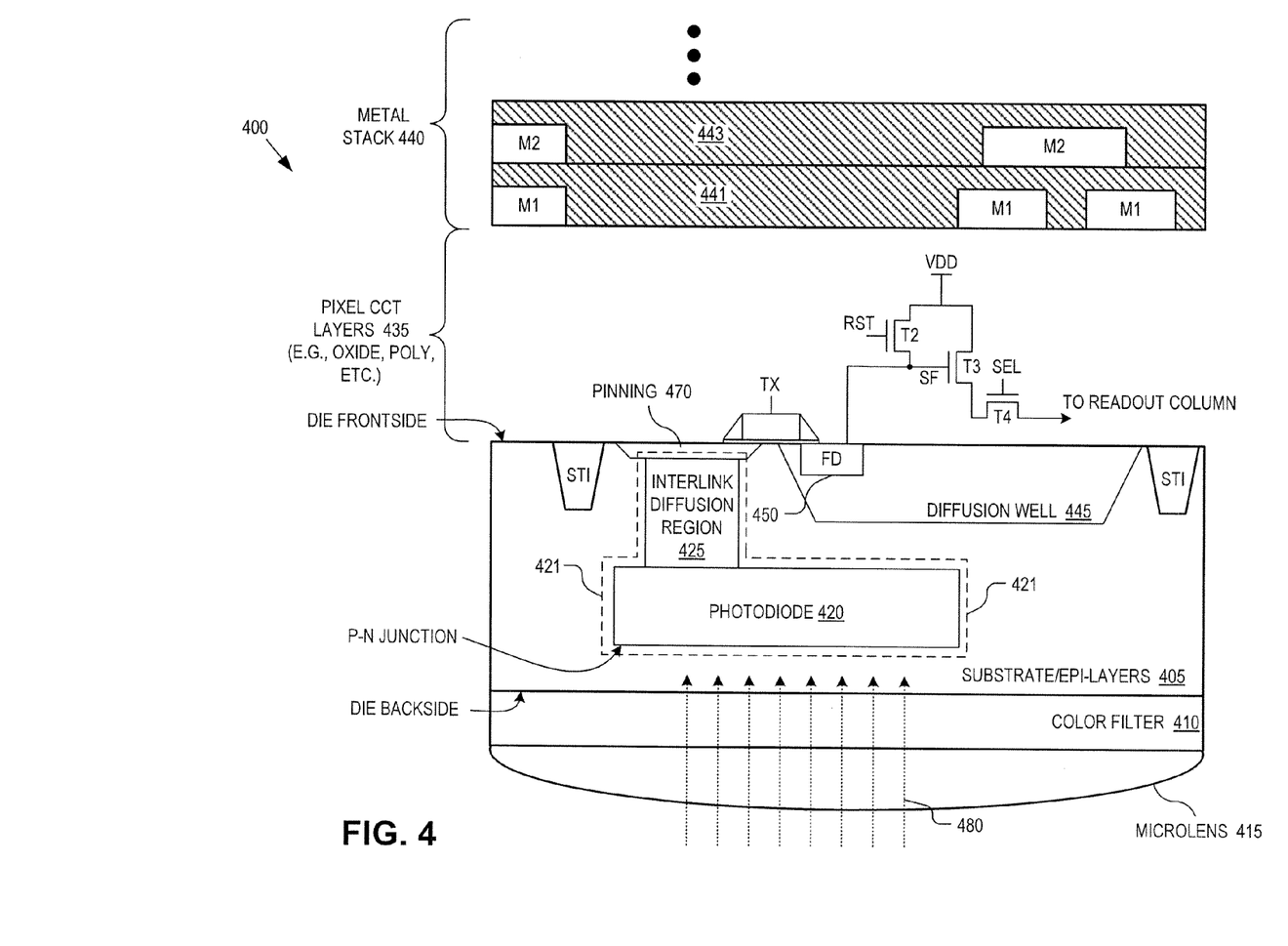
FIG. 4 is a hybrid cross-sectional/circuit illustration of a BSI active pixel, in accordance with an embodiment of the invention.

FIG. 4 is a hybrid cross sectional/circuit illustration of a BSI active pixel 400, in accordance with an embodiment of the invention. Active pixel 400 is one possible implementation of active pixels AP1 to APn within pixel array 205. The illustrated embodiment of active pixel 400 includes a substrate 405, a color filter 410, a microlens 415, a PD region 421 including a doped PD 420 and a doped interlinking diffusion region 425, pixel circuitry layers 435, and a metal stack 440. The illustrated embodiment of pixel circuitry layers 435 include a 4T pixel (other pixel designs may be substituted) disposed over a diffusion well 445. A floating diffusion 450 is disposed within diffusion well 445 and coupled to transfer transistor T1, reset transistor T2, and the gate of SF transistor T3. The illustrated embodiment of metal stack 440 includes two metal layers M1 and M2 separated by intermetal dielectric layers 441 and 443. Although FIG. 4 illustrates only a two layer metal stack, metal stack 440 may include more or less layers (e.g., three metal layers) for routing signals over the frontside of pixel array 205. In one embodiment, a passivation or pinning layer 470 is disposed over interlinking diffusion region 425. Finally, shallow trench isolations ("STI") insulate active pixel 400 from adjacent pixels (not illustrated).

As illustrated, imaging pixel 400 is photosensitive to light 480 incident on the backside of its semiconductor die. Floating diffusion 450 is doped with an opposite conductivity type dopant as diffusion well 445 to generate a p-n junction within diffusion well 445 and thereby electrically isolating floating diffusion 450. Similarly, photodiode 420 is doped to form a p-n junction with the surrounding epitaxial layer to accumulate image charges in response to light 480. In one embodiment, substrate 405 and/or the epitaxial layers formed thereon are doped with P-type dopants. In this case, substrate 405 and the epitaxial layers grown thereon may be referred to as a P-substrate. In a P-substrate embodiment, diffusion well 445 is a P+ well implant, while PD 420, interlinking diffusion region 425, and floating diffusion 450 are N-type doped. In an embodiment where substrate 405 and/or the epitaxial layers thereon are N-type, diffusion well 445 is also N-type doped, while PD 420, interlinking diffusion region 425, and floating diffusion 450 have an opposite P-type conductivity.

Figure 5:
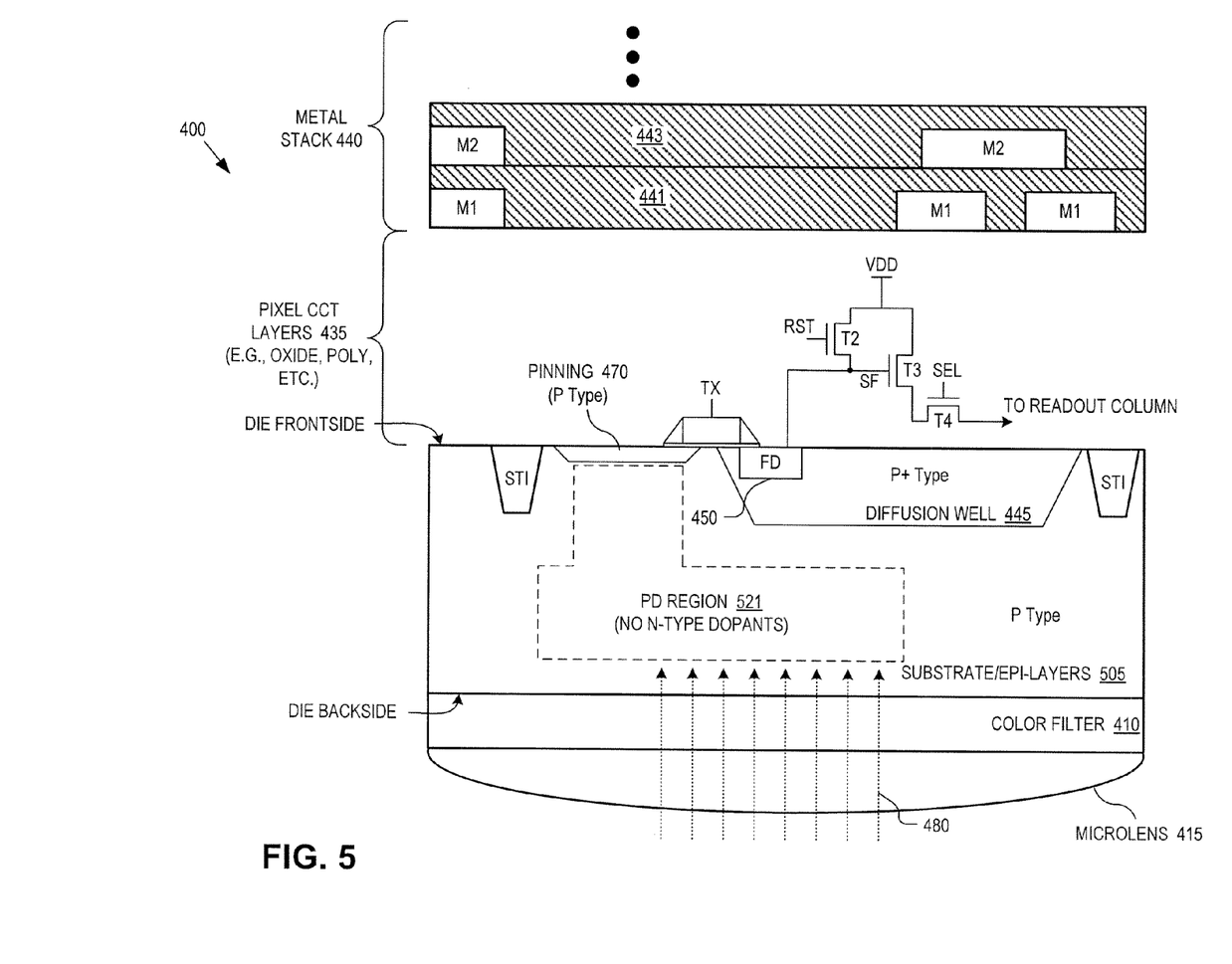
FIG. 5 is a hybrid cross-sectional/circuit illustration of a BSI black reference pixel on a P-type epitaxial substrate layer, in accordance with an embodiment of the invention.

FIG. 5 is a hybrid cross-sectional/circuit illustration of a BSI black reference pixel 500, in accordance with an embodiment of the invention. Black reference pixel 500 is formed on a P-type epitaxial/substrate 505 and the pixel circuitry (e.g., transfer transistor T1) implemented with NMOS transistors over a P-well (diffusion well 445). In one embodiment, black reference pixel 500 is similar to active pixel 400, except PD region 521 is undoped with N-type dopants. As such, PD region 521 retains the same doping characteristic as the surrounding epitaxial semiconductor material (i.e., P-type). Since PD region 521 is not doped with N-type dopants, a p-n junction is not generated and a photodiode is not formed. Accordingly, the structure of black reference pixel 500 is nonresponsive to light 480 since its active region has been removed. However, the backside has not been covered with a metal layer to block out light 480. Rather, the optical path from microlens 415 to PD region 521 is still penetrable by light 480. By rendering black reference pixel 400 insensitive to light, depositing a blocking metal layer on the backside of the die can be avoided.

Since the pixel circuitry within pixel circuitry layers 435 is retained, black reference pixel 500 generates a baseline or black level reference signal from which the photosensitive active pixel 400 can be calibrated to offset or cancel out the non-optically generated portion of its output signal. With the optically sensitive portion (e.g., PD 420 and interlinking diffusion region 425) of black reference pixel 500 removed, photo-generated carriers are not created within PD region 521. Therefore, any signal generated by black reference pixel 500 is the combination of one or more leakage signals, thermally generated signals, or other unwanted signals. By keeping the remaining aspects (e.g., pixel size, pixel circuitry, etc.) of black reference pixel 500 as similar as possible to active pixel 400, these unwanted signal components generated by black reference pixel 500 will closely match or approximate the unwanted signal components generated by active pixel 400. However, it should be appreciated that embodiments of the present invention may still work within acceptable tolerances if other deviations between black reference pixel 500 and active pixel 400 are permitted. For example, in one embodiment, pinning layer 470 may also be removed.

Figure 6:
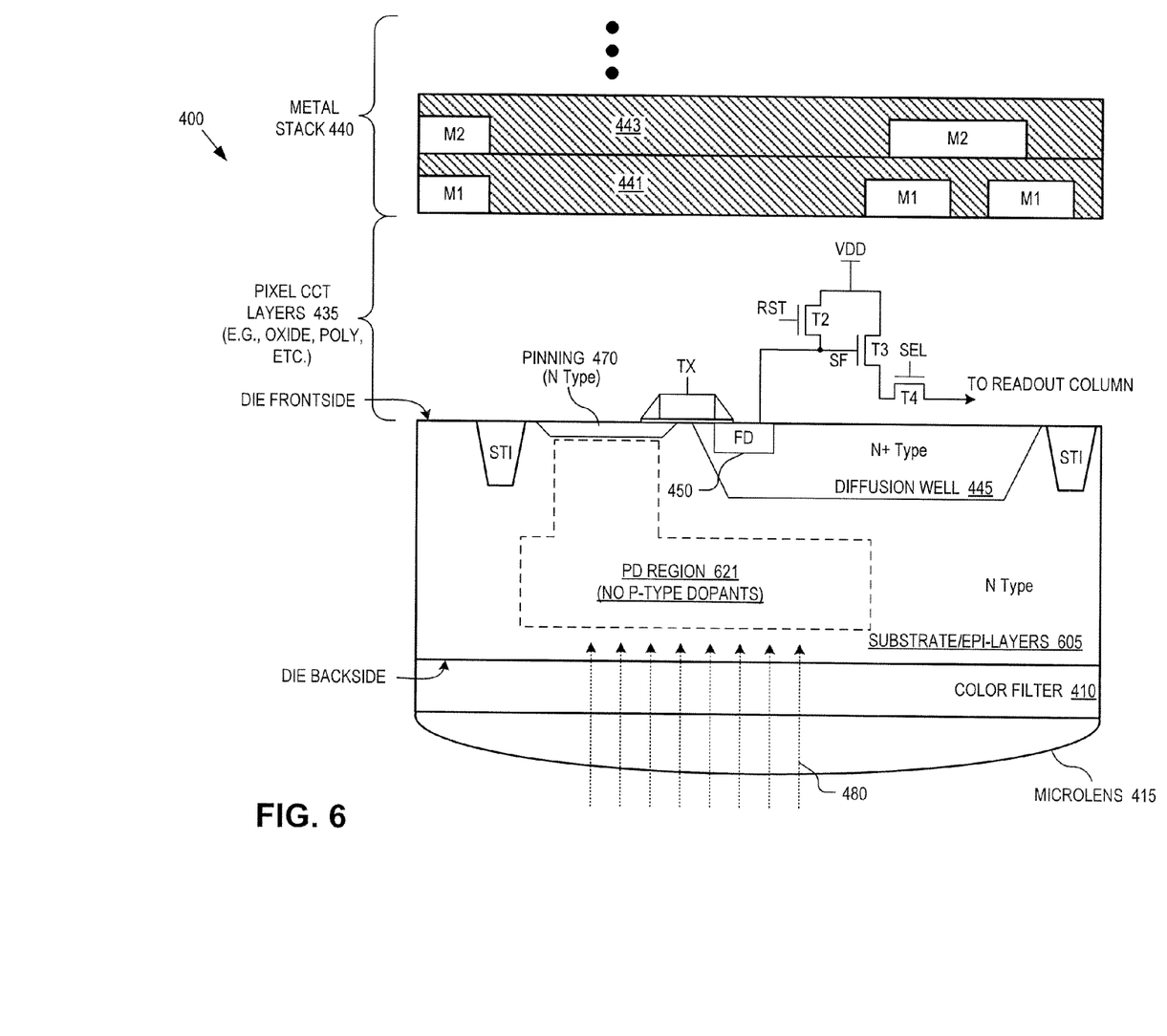
FIG. 6 is a hybrid cross-sectional/circuit illustrating of a BSI black reference pixel on an N-type epitaxial substrate layer, in accordance with an embodiment of the invention.

FIG. 6 is a hybrid cross-sectional/circuit illustration of a BSI black reference pixel 600, in accordance with an embodiment of the invention. Black reference pixel 600 is formed on an N-type epitaxial/substrate 605 and the pixel circuitry (e.g., transfer transistor T1) implemented with PMOS transistors over an N-well (diffusion well 445). Black reference pixel 600 is similar to black reference pixel 500, except the doping conductivity types (i.e., p-type dopants and n-type dopants) are reversed. PD region 621 is undoped with P-type dopants. As such, PD region 521 retains the same doping characteristic as the surrounding epitaxial semiconductor material (i.e., N-type). Since PD region 621 is not doped with P-type dopants, a p-n junction is not generated and a photodiode is not formed. Accordingly, black reference pixel 600 is nonresponsive to light 480 since its active region has been removed.

Figure 7:
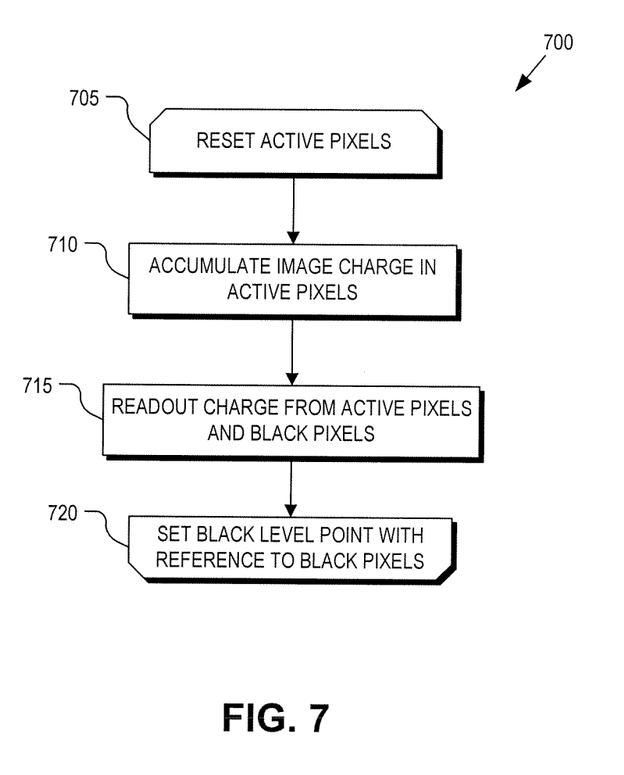
FIG. 7 is a flow chart illustrating a process for operating a BSI imaging system with black reference pixels, in accordance with an embodiment of the invention.

FIG. 7 is a flow chart illustrating a process 700 for operating BSI imaging system 200 with black reference pixels (e.g., black reference pixels 500 or 600), in accordance with an embodiment of the invention. The order in which some or all of the process blocks appear in process 700 should not be deemed limiting. Rather, one of ordinary skill in the art having the benefit of the present disclosure will understand that some of the process blocks may be executed in a variety of orders not illustrated.

In a process block 700, the active pixels of pixel array 205 are reset. Depending upon whether a rolling or global shutter is used some or all active pixels may be reset at a time. Resetting the active pixels includes discharging or charging PD 420 to a predetermined voltage potential, such as VDD. The reset is achieved by asserting both the RST signal to enable reset transistor T2 and asserting the TX signal to enable transfer transistor T1. Enabling T1 and T2 couples PD 420 and floating diffusion 450 to power rail VDD.

Once reset, the RST signal and the TX signal are de-asserted to commence image acquisition by photodiode 420 (process block 710). Light 480 incident on the backside of an active pixel 400 is focused by microlens 415 through color filter 410 onto the backside of PD 420. Color filter 410 operates to filter the incident light 480 into component colors (e.g., using a Bayer filter mosaic or color filter array). The incident photons cause charge to accumulate within the diffusion region of the photodiode.

Once the image acquisition window has expired, the accumulated charge within PD 420 is transferred via the transfer transistor T1 to floating diffusion 450 for readout. In some embodiments, a storage capacitor may be coupled to floating diffusion 450 to temporarily store the image charge. In a process block 715, the SEL signal is asserted to transfer the image data onto the readout column for output to the function logic 215 via readout circuitry 210. It should be appreciated that readout may occur on a per row basis via column lines (illustrated), on a per column basis via row lines (not illustrated), on a per pixel basis (not illustrated), or by other logical groupings.

At the same time that the image data is read out from the active pixels, black level reference signal(s) are readout from the black reference pixels (e.g., BP0 through BP9). Each black reference pixel is logically associated with a portion of the active pixels and its black level reference signal used to offset or configure the black level set point of its associated active pixels.

The processes explained above are described in terms of computer software and hardware. The techniques described may constitute machine-executable instructions embodied within a machine (e.g., computer) readable storage medium, that when executed by a machine will cause the machine to perform the operations described. Additionally, the processes may be embodied within hardware, such as an application specific integrated circuit ("ASIC") or the like.

A machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An imaging sensor pixel array, comprising:
   a semiconductor substrate;
   a plurality of active pixels disposed in the semiconductor substrate for capturing an image, each of the active pixels including a first region for receiving light including a p-n junction for accumulating an image charge and active pixel circuitry coupled to the first region to readout the image charge; and at least one black reference pixel disposed within the semiconductor substrate for generating a black level reference value that includes effects due to dark current within the imaging sensor pixel array without shielding the light from reaching the at least one black reference pixel, the black reference pixel including a second region for receiving light without a p-n junction and black pixel circuitry coupled to the second region without the p-n junction to readout a black level reference signal, wherein the black reference pixel does not include a shielding layer disposed on a light incident side of the imaging sensor pixel array that is positioned to block the light from reaching the second region of the black reference pixel, wherein the black pixel circuitry includes a transfer transistor coupled to the second region such that the black level reference value includes effects due to dark current within the transfer transistor of the black pixel circuitry.

2. The imaging sensor pixel array of claim 1, wherein the second region of the black reference pixel is either undoped or doped to have only one conductivity type and nonresponsive to incident light.

3. The imaging sensor pixel array of claim 2, wherein the imaging sensor pixel array comprises a backside illuminated complementary metal-oxide-semiconductor ("CMOS") array.

4. The imaging sensor pixel array of claim 3, wherein the backside illuminated CMOS array does not include a metal layer disposed on a backside of the imaging sensor pixel array to block light from reaching the black reference pixel.

5. The imaging sensor pixel array of claim 3, further comprising:
a metal stack disposed on a frontside of the backside illuminated CMOS array for routing signals from the active pixels and the at least one black reference pixel; and
an array of microlenses disposed on a backside of the backside illuminated CMOS array for focusing light onto the first region of each of the active pixels.

6. The imaging sensor pixel array of claim 1, wherein the black pixel circuitry is identical to the active pixel circuitry.

7. The imaging sensor pixel array of claim 6, wherein the black pixel circuitry and the active pixel circuitry each comprise:
a transfer transistor coupled between the first or second region and a floating diffusion;
a reset transistor coupled to the floating diffusion;
a source-follower transistor coupled to the floating diffusion to output the image charge or the black level reference signal; and
a select transistor to select the pixel from other pixels for readout.

8. A method of operation of a backside illuminated pixel array, comprising:
exposing a plurality of active pixels and at least one black reference pixel to light incident upon a backside of the active and black reference pixels;
capturing image data within the active pixels in response to the light, wherein the black reference pixel is nonresponsive to the light;
reading out the image data from the active pixels; and
reading out at least one black level reference signal from the at least one black reference pixel, the black level reference signal including effects due to dark current within the backside illuminated pixel array without shielding the light from reaching the at least one black reference pixel, wherein exposing the black reference pixel to light comprises permitting the light to enter the backside of the black reference pixel by not blocking the light from the black reference pixel with a light shielding layer disposed on the backside of the black reference pixel, wherein the black reference pixel includes black pixel circuitry that includes the same circuit elements as active pixel circuitry of each of the active pixels, wherein the black pixel circuitry includes a transfer transistor such that the black level reference signal includes effects due to dark current within the transfer transistor of the black pixel circuitry.

9. The method of claim 8, further comprising adjusting a black level of the active pixels with reference to the black level reference signal from the black reference pixel.

10. The method of claim 8, wherein the backside illuminated pixel array comprises a complementary metal-oxide-semiconductor ("CMOS") pixel array.

11. The method of claim 8, wherein reading out the at least one black level reference signal comprises reading out a thermally generated signal from the black level reference signal using pixel circuitry disposed within the black level reference signal.

12. The method of claim 11,
wherein the black reference pixel includes a first region for receiving the light that is either undoped or doped to have only one conductivity type and nonresponsive to the light,
wherein the active pixels each include a doped photodiode region having a p-n junction for accumulating an image charge in response to the light.

13. An imaging system, comprising:
a backside illuminated array of imaging pixels including:
a plurality of active pixels to capture image signals in response to light incident on a backside of the array; and
at least one black reference pixel for generating a black level reference signal that includes effects due to dark current within the backside illuminated array of imaging pixels without shielding the light from reaching the at least one black reference pixel, a backside of the black reference pixel penetrable by the light but the black reference pixel having a nonresponsive structure to the light, wherein the backside of the black reference pixel is not covered over with a light shield;
readout circuitry coupled to the backside illuminated array of imaging pixels to readout the image signal and the black level signal; and
reference circuitry coupled to receive the black level signal and to adjust a black level set point of the active pixels based at least in part on the black level signal,
wherein the black reference pixel includes black pixel circuitry includes the same circuit elements as active pixel circuitry of each of the active pixels, wherein the black pixel circuitry includes a transfer transistor such that the black level reference signal includes effects due to dark current within the transfer transistor of the black pixel circuitry.

14. The imaging system of claim 13, wherein the black reference pixel does not include a photodiode.

15. The imaging system of claim 14, wherein the black reference pixel includes black pixel circuitry similar to active pixel circuitry included within each of the active pixels, the black pixel circuitry configured to readout a thermally generated signal as the black level reference signal.

16. The imaging system of claim 13, wherein the array of imaging pixels comprises a plurality of black reference pixels dispersed about the array, wherein each of the black references pixels is logically associated with a subset of the active pixels for adjusting the black level set point of the associated active pixels.

17. The imaging system of claim 13, wherein the array of imaging pixels comprises an array of complementary metal-oxide-semiconductor ("CMOS") imaging sensors.

18. The imaging system of claim 17, wherein the backside illuminated array of imaging pixels further includes:
 a metal stack disposed on a frontside of the array for routing signals from the active pixels and the at least one black reference pixel; and
 an array of microlenses disposed on the backside of the array for focusing light onto a doped photodiode region of each of the active pixels.

19. The imaging system of claim 13, wherein the backside of the black reference pixel is not covered over with a metal layer.

* * * * *